United States Patent
Ball

(10) Patent No.: US 6,186,392 B1
(45) Date of Patent: Feb. 13, 2001

(54) METHOD AND SYSTEM FOR FORMING CONTACTS ON A SEMICONDUCTOR COMPONENT BY ALIGNING AND ATTACHING FERROMAGNETIC BALLS

(75) Inventor: Michael Ball, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/489,272

(22) Filed: Jan. 21, 2000

(51) Int. Cl.$^7$ .............................. B23K 35/24; B23K 31/02
(52) U.S. Cl. ................ 228/245; 228/180.22; 228/248.5; 438/613
(58) Field of Search ...................... 438/613–617; 257/737, 738; 228/123.1, 180.22, 254, 248.5, 44.7, 6.2

(56) References Cited

U.S. PATENT DOCUMENTS

| | | |
|---|---|---|
| 3,960,279 | 6/1976 | Hartleroad et al. . |
| 4,004,261 * | 1/1977 | Klingenberg . |
| 4,346,516 * | 8/1982 | Yokuchi et al. . |
| 4,801,065 * | 1/1989 | Colquitt et al. . |
| 4,830,264 | 5/1989 | Bitaillou et al. . |
| 4,983,804 | 1/1991 | Chan et al. . |
| 5,118,027 | 6/1992 | Braun et al. . |
| 5,299,730 | 4/1994 | Pasch et al. . |
| 5,346,775 * | 9/1994 | Jin et al. . |
| 5,401,911 * | 3/1995 | Anderson et al. . |
| 5,447,886 * | 9/1995 | Rai . |
| 5,531,942 | 7/1996 | Gilleo et al. . |
| 5,539,153 * | 7/1996 | Schwiebert et al. . |
| 5,620,927 | 4/1997 | Lee . |
| 5,643,831 | 7/1997 | Ochiai et al. . |
| 5,674,785 | 10/1997 | Akram et al. . |
| 5,739,585 | 4/1998 | Akram et al. . |
| 5,816,482 * | 10/1998 | Grabbe . |
| 5,839,641 * | 11/1998 | Teng . |
| 5,841,198 | 11/1998 | Chia et al. . |
| 5,867,082 * | 2/1999 | Van Zeeland . |
| 5,872,400 | 2/1999 | Chapman et al. . |
| 5,899,737 | 5/1999 | Trabucco . |
| 5,986,348 | 11/1999 | Fukano . |
| 6,100,175 | 8/2000 | Wood et al. . |

* cited by examiner

Primary Examiner—Patrick Ryan
Assistant Examiner—Jonathan Johnson
(74) Attorney, Agent, or Firm—Stephen A. Gratton

(57) ABSTRACT

A method and system for forming contacts on semiconductor components, such as wafers, dice and packages, are provided. The method employs magnets to align and hold ferromagnetic balls on bonding sites of a component substrate. The system includes a holder for holding the component substrate, and magnets on the holder aligned with bonding sites on the component. The system also includes a ball placement mechanism for placing the ferromagnetic balls on the bonding sites, and a bonding mechanism, such as an oven, or a focused energy source, for bonding the ferromagnetic balls to the bonding sites. The ferromagnetic balls can be provided as a ferromagnetic core having an outer solder layer, as a solid ferromagnetic material with a conductive adhesive outer layer, or as ferromagnetic particles embedded in a bondable matrix material. An alternate embodiment system includes a focused magnetic source for dynamically aligning the ferromagnetic balls to the bonding sites.

31 Claims, 5 Drawing Sheets

METHOD AND SYSTEM FOR FORMING CONTACTS ON A SEMICONDUCTOR COMPONENT BY ALIGNING AND ATTACHING FERROMAGNETIC BALLS

FIELD OF THE INVENTION

This invention relates generally to semiconductor manufacture, and more particularly to an improved method and system for forming contacts on a semiconductor component by aligning and attaching ferromagnetic balls to bonding sites on the component.

BACKGROUND OF THE INVENTION

Semiconductor components, such as wafers, dice and packages can include external contacts in the form of solder balls. For some components, such as chip scale packages, the balls can be arranged in a dense array, such as a ball grid array (BGA), or a fine ball grid array (FBGA). The balls provide a high input/output capability for a component, and permit the component to be surface mounted to a mating component such as a printed circuit board (PCB).

One conventional method for attaching the balls to a component substrate uses a solder reflow process. With this method the substrate can include bonding sites, such as bond pads, or land pads, on which layers of flux are deposited. A platen can be used to hold the substrate, while the flux is deposited on the bonding sites in a required pattern. After depositing the flux layers, the solder balls can be placed on the flux layers, and a convection furnace used to reflow the flux layers. After cooling, a permanent solder bond is formed between the bonding sites and solder balls.

Because the solder balls have a natural attraction for the flux layers, the alignment step is facilitated. One problem with this method is that during the heating step, the flux can liquefy prior to the balls. As the flux liquefies, the balls are free to move and can roll off the bonding site. This can cause missing and mis-aligned balls, and also defective components. Defects can lower throughput in a production process, and necessitate expensive rework procedures.

In order to maintain the balls in alignment with the bonding sites, a ball retaining plate is sometimes employed during the aligning and heating steps. For example, the ball retaining plate can include separate cavities for retaining each solder ball. A vacuum can also be applied to the cavities to provide a positive force for holding the balls in the cavities. U.S. Pat. No. 5,118,027 to Braun et al. discloses a reflow process in which a ball retaining plate and vacuum are used to hold the solder balls.

In general this method, can be performed on balls that have a diameter of about 0.012-in (0.305 mm) or larger. A center to center pitch of the balls can be about 0.018-in (0.457) mm. However, as the balls become smaller, and the spacing between the balls become tighter, it becomes more difficult to align and attach the balls.

Another problem with prior art aligning and attaching methods is the difficulty of fabricating ball retaining plates with the required feature sizes. For example, for fine ball grid array (FGBA) components, the balls can have a diameter as small as 0.005-in (0.127 mm), and a center to center pitch of only about 0.008-in (0.228 mm). It is difficult to make ball retaining plates with the required features sizes using conventional machining processes.

Balls can also be attached to bonding sites by laser reflow, soldering, brazing, welding, or applying a conductive adhesive. In each case some method must be employed to align and maintain the alignment of the balls to the bonding sites. A solder ball bumper, for example, employs a tool to precisely position pre-formed balls on a bonding site, and a laser to initiate reflow. However, solder ball bumpers, and similar apparatus, are relative expensive to purchase and maintain, and can have a limited throughput for volume semiconductor manufacture.

The balls, rather than being pre-formed members, can also be formed directly on the bonding sites using a deposition process such as screen printing, evaporation through a mask, or chemical vapor deposition. These deposition methods each have limitations with respect to the size and spacing of the balls, and also require relatively expensive equipment.

In view of the foregoing, there is a need in the art for improved methods and apparatus for forming contacts on semiconductor components.

SUMMARY OF THE INVENTION

In accordance with the present invention, an improved method and system for forming contacts on a semiconductor component are provided. The semiconductor component can comprise a semiconductor wafer, a semiconductor die, a semiconductor package, a chip scale package, or a separate substrate (e.g., BGA substrate, PCB) for a semiconductor component. The semiconductor component includes a pattern of bonding sites, such as bond pads, wherein the balls will be attached to form the external contacts for the component.

The method, simply stated, comprises aligning and attaching ferromagnetic balls to the component using magnetic force. The method can be performed using a holder that includes magnets having a pattern matching that of the bonding sites on the component. The holder can also include an alignment opening configured to retain the component, and to contact peripheral edges of the component to align the bonding sites to the magnets.

In an illustrative embodiment the balls are spherically shaped, and include a ferromagnetic core such as iron, steel, nickel, cobalt, titanium, aluminum or magnetic stainless steel, embedded in an outer solder layer. Alternately, the balls can comprise ferromagnetic particles embedded in a bondable matrix material, such as a polymer adhesive, or a solder alloy. As another alternative, the balls can comprise a unitary ferromagnetic metal formed in a spherical shape. As yet another alternative, the balls can comprise a ferromagnetic material covered with an electroconductive polymer adhesive.

In the illustrative embodiment the bonding step is performed by placing the component and the holder in a furnace heated to a temperature sufficient to reflow the balls. Alternately the bonding step can be performed using a focused energy source such as a laser, or a beam of high energy xenon light. In either case, because the balls are aligned with the bonding sites, and held on the bonding sites by magnetic force, solder flux does not need to be applied to the balls, or to the bonding sites. In addition, the balls can be pre-treated to remove surface oxides that inhibit the bonding process.

A system for performing the method includes the holder, a ball placement mechanism for placing the balls on the bonding sites, and a bonding mechanism, such as an oven, for heating and bonding the balls to the bonding sites. An alternate embodiment system includes a bonding mechanism which includes a focused energy source such as a laser, or a high-energy xenon light source. Another alternate embodiment system includes a focused energy source and a focused magnetic source.

DETAILED DESCRIPTION OF THE PREFERRED EMBODIMENTS

Referring to FIGS. 1A–1D, 2, and 3, various prior art semiconductor components having external contacts in the form of solder balls 10 are illustrated. As used herein, the term "semiconductor component" refers to an electronic component that includes a semiconductor die. Exemplary semiconductor components include bare semiconductor dice, chip scale packages, ceramic or plastic semiconductor packages, semiconductor wafers, BGA devices, multi chip modules, printed circuit boards, and electronic assemblies, such as field emission displays.

Figure 1A:
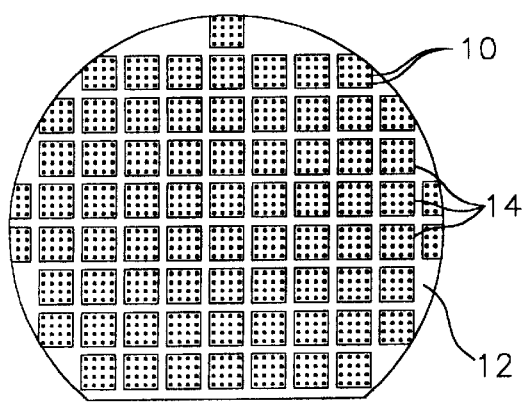
FIG. 1A is a plan view of a prior art bumped semiconductor wafer.
Figure 1B:
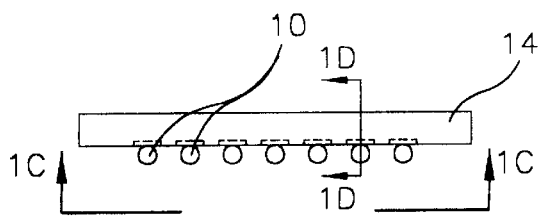
FIG. 1B is an enlarged side elevation view of a bumped die which has been separated from the wafer.

In FIG. 1A the substrate is a semiconductor wafer 12 comprising a plurality of semiconductor dice 14. FIG. 1B illustrates a die 14 that has been separated from the wafer 12. Each die 14 includes a plurality of balls 10 which can be attached to the die 14 using the method of the invention. The method of the invention can be performed on the wafer 12 prior to singulation of the individual dice 14. Alternately the method of the invention can be performed on singulated dice 14.

Figure 1D:
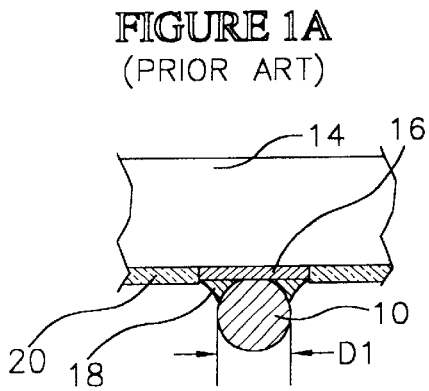
FIG. 1D is an enlarged cross sectional view taken along section line 1D—1D of FIG. 1B showing a ball bonded to a bonding site on the die.
Figure 1C:
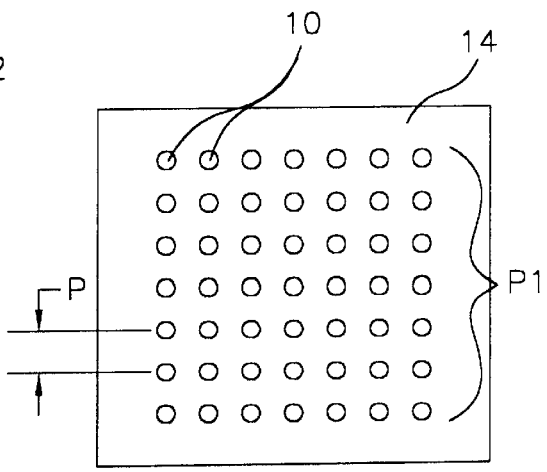
FIG. 1C is a bottom view of the die taken along section line 1C—1C of FIG. 1B.

As shown in FIG. 1C, the balls 10 are formed on the die 14 in a pattern P1. In the illustrative embodiment, the pattern P1 is a dense grid array, such as a ball grid array (BGA). By way of example, a representative diameter D1 for the balls 10 can be about 0.005-in (0.127 mm) to 0.050-in (1.270 mm) or greater. A representative pitch P (center to center spacing) of the balls 10 can be from about 0.008-in (0.228 mm) to about 0.060-in (1.524 mm) or greater.

Prior to performing the method of the invention, the die 14 can be provided with a plurality of bonding sites 16. FIG. 1D illustrates one example for a bonding site 16 in the form of a thin film aluminum bond pad embedded in a passivation layer 20. FIG. 1D also illustrates a single ball 10 that has been bonded to the bonding site 16 on the die 14 using a solder flux 18.

Figure 2:
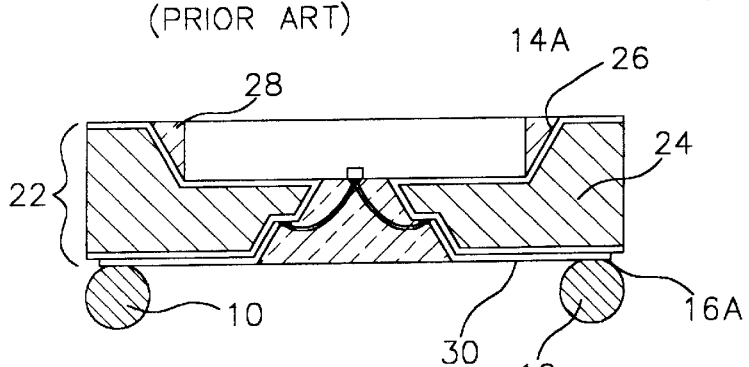
FIG. 2 is an enlarged cross sectional view of a prior art chip scale package having balls.

FIG. 2 illustrates another prior art semiconductor component in the form of a chip scale package 22. The chip scale package 22 includes a silicon body 24 having a recess 26 wherein a semiconductor die 14A is held by an encapsulant 28. The package 22 also includes conductors 30 wire bonded to the die 14A. The conductors 30 include bonding sites 16A for the balls 10. Further details of the chip scale package 22 are described in U.S. Pat. No. 5,674,785 to Akram et al. entitled "Method Of Producing A Single Piece Package For Semiconductor Die", and in U.S. Pat. No. 5,739,585, entitled "Single Piece Package For Semiconductor Die", both of which are incorporated herein by reference.

Figure 3:
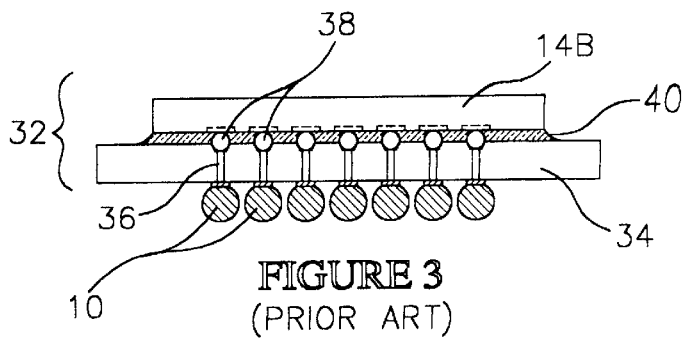
FIG. 3 is an enlarged cross sectional view of another prior art chip scale package having balls on a separate substrate.

FIG. 3 illustrates another prior art semiconductor component in the form of a chip scale package 32. The chip scale package 32 includes a die 14B and a BGA substrate 34. The BGA substrate 34 includes balls 10 in electrical communication with internal conductors 36 in the substrate 34. In addition, an adhesive layer 40 attaches the BGA substrate 34 to the die 14B, with the internal conductors 36 on the BGA substrate 34 in electrical communication with bumps 38 on the die 14B. The BGA substrate 34 can be formed separately, and the balls 10 attached using the method of the invention prior to attachment of the die 14B. Alternately the balls 10 can be attached to the BGA substrate 34 after attachment of the die 14B.

Figure 4:
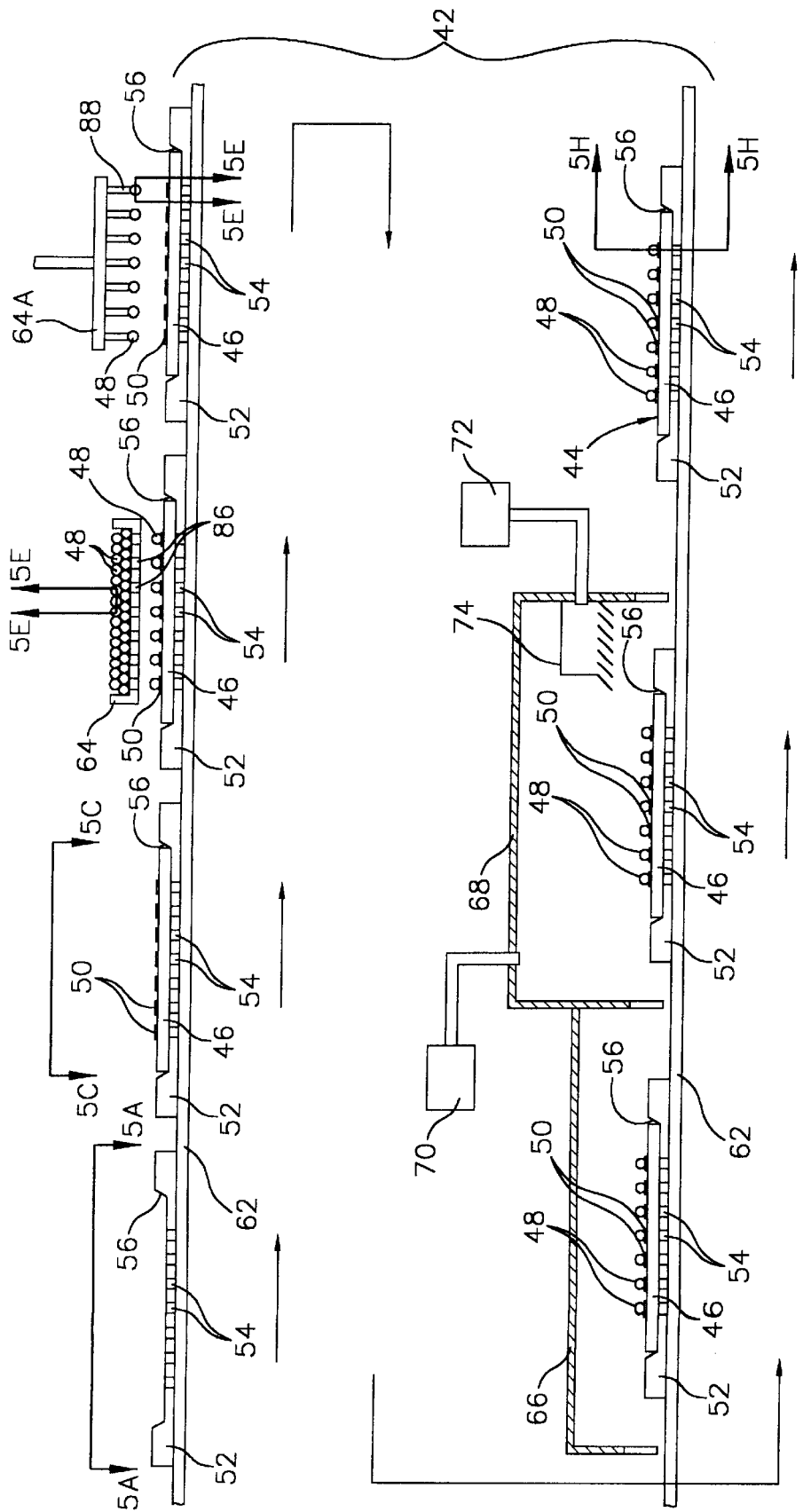
FIG. 4 is a schematic diagram illustrating a system and steps in a method for forming contacts on a semiconductor component in accordance with the invention.

Referring to FIG. 4, a system 42 for forming contacts on a semiconductor component 44 by aligning and attaching ferromagnetic balls 48 to the component 44 is illustrated.

The component 44 includes a component substrate 46 having an area array of bonding sites 50. The component 44 can comprise a bare semiconductor die, a chip scale package, a ceramic or plastic semiconductor package, a semiconductor wafer, a BGA device, a multi chip module, a printed circuit board, or an electronic assembly substantially as previously described. In addition, the completed component the ferromagnetic balls 48 form the external contacts for the component 44, and provide input/output terminals from the outside world to the integrated circuits contained on the component 44.

The bonding sites 50 can comprise metal pads on the component substrate 46 having a required metallurgy. For example, the bonding sites 50 can comprise aluminum or copper pads, and a non-oxidizing solder wettable outer layer, such as gold, platinum or palladium. In addition, the bonding sites 50 can be formed in a dense area array, such as a grid array of separate rows and columns.

As shown in FIG. 4, the system 42 includes a holder 52 for holding the component substrate 46, and a conveyor 62 for moving the holder 52, with the component substrate 46 thereon, to the different stations to be hereinafter described.

Figure 5A:
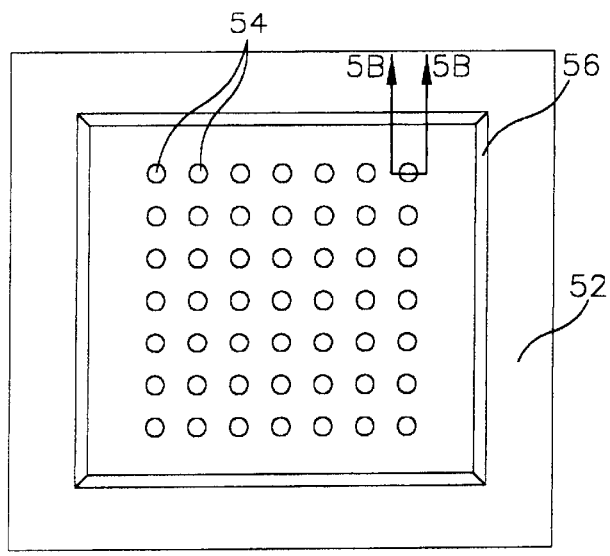
FIG. 5A is an enlarged plan view taken along line 5A—5A of FIG. 4 illustrating a holder apparatus constructed in accordance with the invention.

As shown in FIG. 5A, the holder 52 includes a plurality of magnets 54, and an alignment opening 56 for aligning the component substrate 46 to the magnets 54. The alignment opening 56 comprises a recess, or a cavity in the holder 52 configured to retain the component substrate. In addition, the alignment opening 56 has a peripheral outline corresponding to a peripheral outline of the component substrate 46. The alignment opening 56 includes sloped sidewalls configured to engage the peripheral edges of the component substrate 46 to guide and align the component substrate 46 with respect to the magnets 54.

The holder 52 can comprise a heat resistant material such as silicon, ceramic, or photo-machineable glass having a coefficient of thermal expansion (CTE) that is close to that of the component substrate 46. In addition, these materials are etchable for forming the features of the holder 52, such as the alignment opening 56 and openings for the magnets 54. Selection of the etchant and etching process will depend on the material of the holder 52. With the holder 52 formed of silicon, a suitable wet etchant comprises potassium hydroxide (KOH), or alternately a solution of tetra-methyl ammonium hydroxide (TMAH). With the holder 52 formed of a ceramic material, a suitable wet etchant comprises a solution of HF. Also with ceramic an ion milling process can be used to etch holder 52. With the holder 52 formed of a photo-machineable glass a suitable wet etchant comprises HF. In addition, photo-machineable glasses and etchants are commercially available from Dow Corning under the trademark "FOTOFORM".

The holder 52 can also be formed of a plastic material molded with required features, or a metal material machined with required features. Suitable plastics for the holder 52 include thermoplastic plastics, thermosetting plastics and liquid crystal polymers. Exemplary plastics include polyetherimide (PEI) and polyphenyl sulfide (PPS). The holder 52 can also include a carbon filler, or a metal layer (not shown) to provide electrical conductivity, and electrostatic discharge (ESD) protection for the component substrate 46.

Figure 5B:
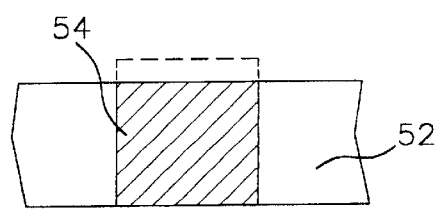
FIG. 5B is an enlarged cross sectional view taken along section line 5B—5B of FIG. 5A illustrating a magnet on the holder.

As also shown in FIG. 5A, the magnets 54 are arranged in a pattern that exactly matches the pattern of the bonding sites 50 on the component substrate 46. In addition, as shown in FIG. 5B, the magnets 54 can be co-planar to the surface of the holder 52, or alternately raised above the surface of the holder 52, as indicated by the dotted lines.

With the holder 52 formed of an etchable material, openings can be etched in the holder 52, and then filled with a ferromagnetic material such as iron, steel, nickel, cobalt, titanium, aluminum or magnetic stainless steel, using a suitable deposition process. Suitable deposition processes include CVD, sputtering, screen printing and evaporation. Once deposited, the ferromagnetic material can be magnetized by subjecting the material to a strong magnetic field to form the magnets 54.

The magnets 54 can also be formed of permanently magnetized materials that are press fitted, or adhesively attached, to openings in the holder 52. For example, rare earth elements can be used to make particularly strong magnets known as "rare earth magnets". Also with the holder 52 formed of a plastic material, the magnets 54 can be molded into the structure of the holder 52.

Figure 5C:
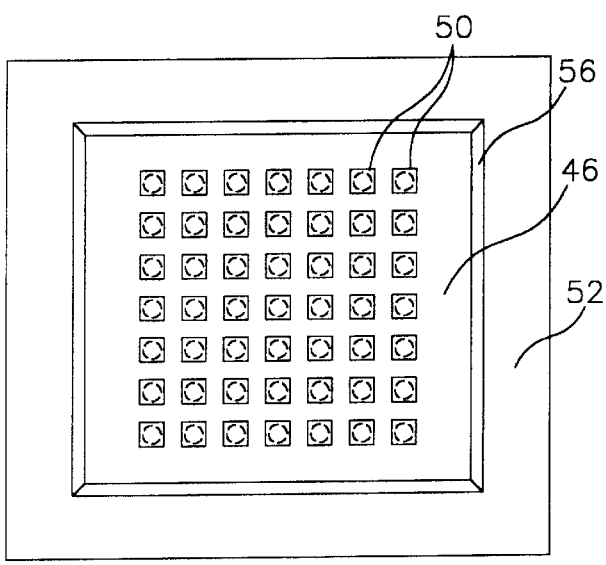
FIG. 5C is an enlarged plan view taken along line 5C—5C of FIG. 4 illustrating bonding sites on the semiconductor component.
Figure 5D:
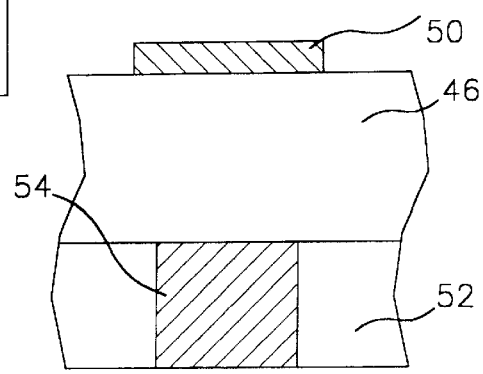
FIG. 5D is an enlarged cross sectional view taken along section line 5D—5D of FIG. 5C illustrating alignment of the magnets on the holder with the bonding sites on the component.

As shown in FIGS. 5C and 5D, with the component substrate 46 held in the holder 52, the bonding sites 50 on the component substrate 46, are aligned with the magnets 54 on the holder 52. In addition, this alignment is achieved and maintained by the alignment opening 56 in the holder 52.

Referring again to FIG. 4, initially the holder 52 is provided, and the component substrate 46 is placed on the holder 52. The component substrate 46 can be placed on the holder 52 utilizing equipment that is known in the art, such as vacuum actuated pick and place machinery. The conveyor 62 is configured to support and to move the holder 52 to the different stations of the system 42, as is required. The conveyor 62 can be in the form of a belt, a chain, a walking beam or an indexing table.

In addition to the holder 52 and the conveyor 62, the system 42 also includes a ball placement mechanism 64 or 64A. For illustrative purposes two different ball placement mechanisms 64 or 64A are illustrated. However, in actual practice only one ball placement mechanism 64 or 64A needs to be employed. The ball placement mechanism 64 or 64A is adapted to place ferromagnetic balls 48 on the bonding sites 50 of the component substrate 46, one ball per site.

The ball placement mechanism 64 includes a hopper or reservoir which contains a supply of the ferromagnetic balls 48. The ball placement mechanism 64 also includes a plurality of openings 86 aligned with the bonding sites 50 on the component substrate 46. The ball placement mechanism 64 is adapted to drop the ferromagnetic balls 48 from the hopper, and through the openings 86, onto the bonding sites 50. During this procedure the magnets 54 on the holder 46 exert magnetic forces on the bonding sites 50, and on the ferromagnetic balls 48, such that alignment and placement of the ferromagnetic balls 48 on the bonding sites 50 is facilitated. The magnets 54 also hold the ferromagnetic balls 48 on the bonding sites 50 as the conveyor 62 transports the holder 46 to the remaining stations of the system 42. Because of the holding power of the magnets 54 for some applications solder flux does not to be employed in the subsequent bonding step.

The ball placement mechanism 64A includes a plurality of vacuum pick up heads 88 having a pattern matching that of the bonding sites 50 on the component substrate 46. The vacuum pick up heads 88 are adapted to pick the ferromagnetic balls 48 out of a reservoir (not shown) and to deposit the balls 48 onto the bonding sites 50. Once again the magnets 54 facilitate alignment and placement of the balls 48 on the bonding sites 50, and hold the balls 48 on the bonding sites 50 for further processing.

Figure 5E:
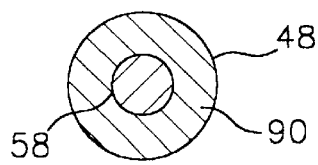
FIG. 5E is an enlarged cross sectional view taken along section line 5E—5E of FIG. 4 illustrating a solder ball with a ferromagnetic core.

Referring to FIG. 5E, a cross section of a single ferromagnetic ball 48 is illustrated. The ferromagnetic ball 48 includes a ferromagnetic core 58, and a solder outer layer 90. The ferromagnetic core 58 comprises a ferromagnetic material such as iron, steel, nickel, cobalt, titanium aluminum, or magnetic stainless steel. The ferromagnetic core 58 can be formed using techniques that are known in the art. One technique is to drop a molten material from an orifice into a gaseous or liquid cooling medium. This forms the ferromagnetic core 58 with a required size and spherical shape. The ferromagnetic core 58 can then be coated with solder, such as by immersion in liquid solder, to form the solder outer layer 90. The solder outer layer 90 can also be formed using a suitable deposition process such as evaporation, sputtering, CVD, or electroless deposition.

The solder outer layer 90 can comprise a conventional solder alloy such as 95%Pb/5%Sn, 60%Pb/40%Sn, 63%Sn/37%Pb, or 62%Pb/36%Sn/2%Ag. Depending on their composition these Pb/Sn solders will have a melting point of from about 150° C. to about 200° C. For some applications, the solder outer layer 90 can be pre-treated to remove surface oxides. One such pre-treatment is referred to as "Plasma Assisted Dry Soldering" and is described in U.S. Pat. Nos. 4,921,157 and 5,866,986, both of which are incorporated herein by reference. In general, this process involves subjecting the balls 48 to an RF generated plasma containing a fluorine species, such as $CF_4$ or $SF_6$, to convert oxides on the surface of the solder outer layer 90 into fluorine compounds.

Alternately, rather than solder, the ferromagnetic core 58 can be coated with an electroconductive thermoplastic or thermosetting adhesive material, such as a silver or gold filled polymer. These material are available from Alpha Metals of Jersey City, N.J.; A.I. Technology, Trenton, N.J.; and Sheldahl, Northfield, Minn.

Figure 5F:
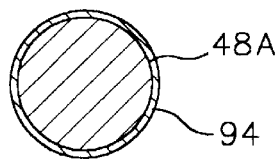
FIG. 5F is an enlarged cross sectional view equivalent to FIG. 5E of an alternate embodiment ball comprising a solid ferromagnetic material.

FIG. 5F illustrates an alternate embodiment ferromagnetic ball 48A which comprises a solid ferromagnetic sphere such as iron, steel, nickel, cobalt, titanium aluminum, or magnetic stainless steel. As will be further explained, this embodiment requires the ball 48A to be bonded to the bonding site 50 using bonding fillets 60 (FIG. 5I). The ferromagnetic ball 48A can also include an outer adhesive layer 94 formed of an electroconductive thermoplastic or thermosetting adhesive material, such as a silver or gold filled polymer, as previously described. Such an outer adhesive layer 94 permits the ball 48A to be bonded without the bonding fillets 60.

Figure 5G:
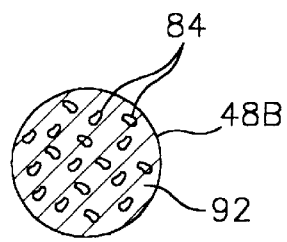
FIG. 5G is an enlarged cross sectional view equivalent to FIG. 5E of an alternate embodiment ball comprising ferromagnetic particles embedded in a bondable matrix material.

FIG. 5G illustrates an alternate embodiment ferromagnetic ball 48B. In this embodiment, the ball 48B comprises a plurality of ferromagnetic particles 84 embedded in a bondable matrix material 92. Suitable materials for the ferromagnetic particles 84 include iron, steel, nickel, cobalt, titanium aluminum, and magnetic stainless steel. In the illustrative embodiment, the bondable matrix material 92 comprises a thermoplastic or thermosetting polymer adhesive material. However, the bondable matrix material 92 can alternately comprise solder.

Exemplary thermoplastic adhesives for the bondable matrix material 92 include phenoxy resin, polyester (PET), polysulfone, polyacrylate, and polyurethane. Exemplary thermosetting adhesives include epoxy, polyimide, silicone, cyanate ester and phenolic resin.

Depending on the material the ferromagnetic particles 84 can be about 1–3 µm in diameter. For simplicity, the particles 84 in FIG. 5G are shown as being separated. However, in actual practice the particles 84 must touch to provide a conductive path through the ferromagnetic ball 48B. In addition, the particles 84 can have a dendritic structure with multiple points for penetrating oxide layers on the bonding sites 50, and corresponding contacts (not shown) on a mating component (e.g., PCB)

The ferromagnetic balls 48B can be fabricated using techniques that are known in the art. For example, U.S. Pat. No. 5,531,942, incorporated herein by reference, discloses a method for making adhesive spheres by dropping an adhesive paste comprising metal particles in a polymer matrix, through a heated fluid. This method can be used to make the ferromagnetic balls 48B with a diameter of from about 5 µm to 25 µm.

Referring again to FIG. 4, following placement of the ferromagnetic balls 48 on the bonding sites 50, the holder 52 with the component substrate 46 thereon, is transported to a preheat chamber 66. The preheat chamber 66 comprises an oven having an inert atmosphere and heated to a temperature that is less than the melting point of the solder outer layer 90 (FIG. 5E). A representative temperature range can be from about 120° C. to 150° C. The preheat chamber 66 heats the ferromagnetic balls 48 and the bonding sites 50 for several minutes which facilitates a subsequent solder reflow step. During the preheating step the magnets 54 continue to hold the ferromagnetic balls 48 on the bonding sites 50.

Following preheating of the ferromagnetic balls 48 and the bonding sites 50, the holder 52 with the component substrate 46 thereon, is transported to bonding mechanism in the form of a reflow chamber 68. The reflow chamber 68 is maintained at a temperature greater than the melting point of the solder outer layer 90 (FIG. 5E). This melts or reflows the solder outer layer 90 and forms a metallurgical bond with the bonding sites 50. A representative temperature range can be from 150° C. to 200° C. The reflow chamber 68 can also include an inert gas source 70, such as $N_2$, such that oxidation of the solder outer layer 90 (FIG. 5E) is minimized. In addition, the reflow chamber 68 can include a hood 74 in flow communication with a cooled inert gas source 72, such as $N_2$, such that the ferromagnetic balls 48 and the bonding sites 50 can be cooled following bonding.

Figure 5H:
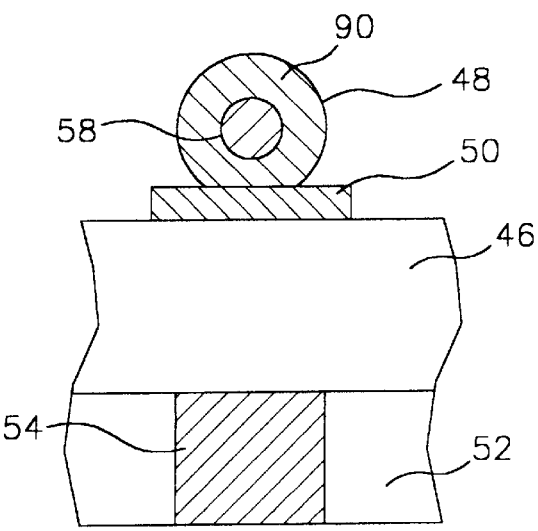
FIG. 5H is an enlarged cross sectional view taken along section line 5H—5H of FIG. 4 illustrating the balls of FIG. 5E bonded to the bonding sites on the component.
Figure 5I:
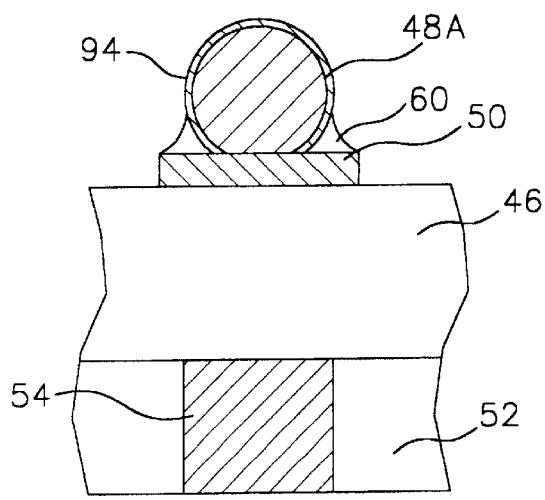
FIG. 5I is an enlarged cross sectional view equivalent to FIG. 5H illustrating the balls of FIG. 5F bonded to the bonding sites on the component.

During the reflow step the magnets 54 continue to hold the ferromagnetic balls on the bonding sites 50. Following the reflow step, the conveyor 62 transports the holder 52 with the completed component 44 thereon out of the reflow chamber 68. As shown in FIG. 5H, the outer solder layer 90 has fused to the bonding sites 50 bonding the ferromagnetic balls 48 to the bonding sites 50. Because the magnets 54 hold the ferromagnetic balls 48 on the bonding sites 50 throughout the bonding process, there is no need to apply solder flux to the ferromagnetic balls 48, or to the bonding sites 50. This also eliminates a flux cleaning step.

As shown in FIG. 5I, the solid ferromagnetic balls 48A can be bonded to the bonding sites using bonding fillets 60. In this case a solder flux can be employed to form the bonding fillets. In addition, the same system 42 (FIG. 4) can be used to bond the solid ferromagnetic balls 48A to the bonding sites 50. Also, rather than using bonding fillets 60, the solid ferromagnetic balls 48A can include the electroconductive adhesive layer 94 which can be used to bond the balls 48A to the bonding site 50.

Figure 5J:
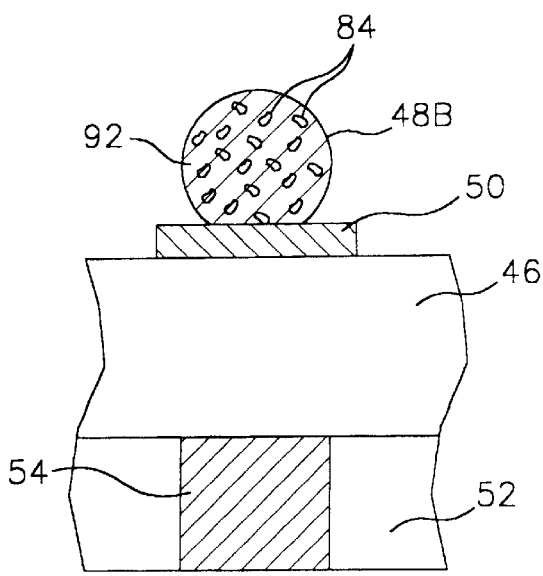
FIG. 5J is an enlarged cross sectional view equivalent to FIG. 5H illustrating the balls of FIG. 5G bonded to the bonding sites on the component.

As shown in FIG. 5J, the ferromagnetic balls 48B having the ferromagnetic particles 84 and bondable matrix material 92 can be bonded to the bonding sites 50 using essentially the same system 42 (FIG. 4). With the bondable matrix material 92 comprising a polymer adhesive, the reflow oven 68 can be heated to a temperature configured to cure, rather than reflow, the bondable material 92. Also, for some polymer adhesive materials the ferromagnetic balls 48B can be placed in compression during the curing step. A weight or jig (not shown) can be used for compressing the ferromagnetic balls 48B during the curing step. With the bondable matrix material 92 comprising solder, a reflow step as previously described, can be used to bond the ferromagnetic balls 48B to the bonding sites 50.

Figure 6:
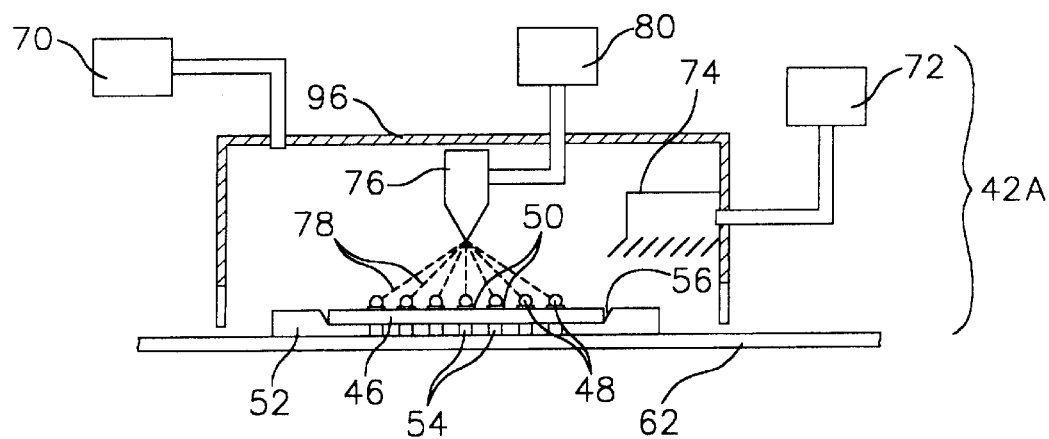
FIG. 6 is a schematic diagram of an alternate embodiment system employing a focused energy source.

Referring to FIG. 6, an alternate embodiment system 42A is illustrated. The system 42A is substantially similar to the system 42 (FIG. 5) previously described. However, in the system 42A, a bonding mechanism comprises a focused energy source 76, rather than an oven, for heating and bonding the ferromagnetic balls 48 to the bonding sites 50.

In particular, the system 42A includes a chamber 96 having the focused energy source 76 and associated power supply 80. The focused energy source 76 is configured to focus an energy beam 78 on the ferromagnetic balls 48 to heat the balls 48 to a temperature above the melting point of the solder outer layer 90. This reflows the solder outer layer 90 (FIG. 5B) and bonds the balls 48 to the bonding sites 50. The focused energy source 76 can comprise a high-energy xenon light apparatus, or alternately a laser. Suitable xenon light apparatus are manufactured by Panasonic Factory Automation Company, a Division of Matsuchita Electric Corporation of America. Suitable lasers are manufactured by General Scanning of Sommerville, Mass.

Figure 7:
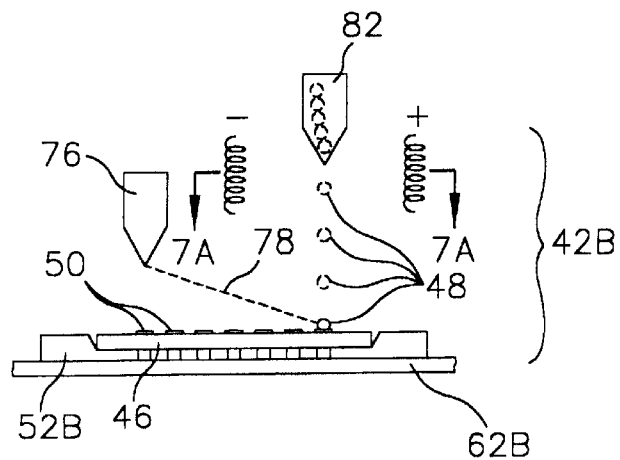
FIG. 7 is a schematic diagram of an alternate embodiment system employing a focused energy source and a focused magnetic source.
Figure 7A:
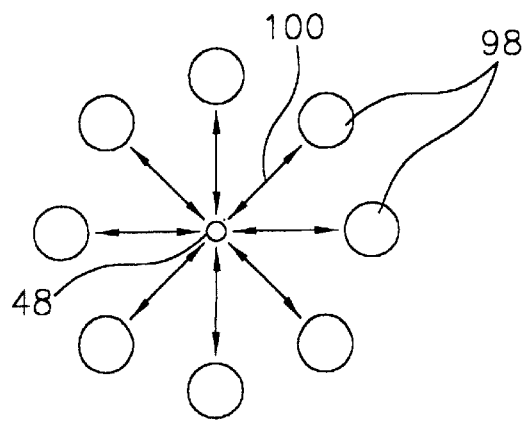
FIG. 7A is a plan view taken along section line 7A—7A of FIG. 7 illustrating alignment of moving ferromagnetic balls with electromagnets.

Referring to FIGS. 7 and 7A, an alternate embodiment system 42B is illustrated. The system 42B includes a holder 52B and a conveyor 62B, which function substantially as previously described. However, rather than having magnets in the holder 52B, the system 42B includes electro magnets 98 that form a focused magnetic source for focusing magnetic energy on the ferromagnetic balls 48. As shown in FIG. 7A, the electro magnets 98 can be configured to exert magnetic forces 100 of a controllable magnitude, and from different directions on the ferromagnetic balls 48. This allows the ferromagnetic balls 48 to be dynamically aligned with, or "aimed" at the bonding sites 50 by controlling the magnetic forces 100.

The system 42B also includes a ball nozzle 82 that drops, or alternately propels, the ferromagnetic balls 48 onto the bonding sites 50. The ball nozzle 82 can operate on compressed air or gravity such that the balls 48 are accelerated through a space between the electro magnets 98. In addition, the system 42B includes a focused energy source 76 that directs a focused energy beam 78 onto the balls 48 for bonding the balls 48 to the bonding sites 50, substantially as previously described.

Thus the invention provides an improved method, system and holder apparatus for aligning and attaching ferromagnetic balls to a semiconductor component. Although the invention has been described with reference to certain preferred embodiments, as will be apparent to those skilled in the art, certain changes and modifications can be made without departing from the scope of the invention, as defined by the following claims.

I claim:

1. A method for forming contacts on a semiconductor component comprising:
   providing a plurality of bonding sites on the component;
   providing a plurality of balls comprising a ferromagnetic material;
   providing a plurality of magnets configured to direct magnetic forces through the bonding sites to the balls;
   providing a holder configured to hold the component and to align the magnets and the bonding sites;
   aligning the balls to the bonding sites using the magnets; and
   bonding the balls to the bonding sites.

2. The method of claim 1 wherein the bonding step comprises heating the balls or the bonding sites.

3. A method for forming contacts on a semiconductor component comprising:
   providing a plurality of bonding sites on the component;
   providing a plurality of balls comprising a ferromagnetic material;
   providing a holder comprising a plurality of magnets configured to direct magnetic forces through the bonding sites to the balls, the holder configured to hold the component and to align the bonding sites to the magnets;
   aligning the balls to the bonding sites using the magnets; and
   bonding the balls to the bonding sites.

4. The method of claim 3 wherein each ball comprises a ferromagnetic core and a solder outer layer.

5. The method of claim 3 wherein each ball comprises a solid ferromagnetic sphere.

6. A method for forming contacts on a semiconductor component comprising:
   providing a plurality of bonding sites on the component;
   providing a plurality of balls, each ball comprising a plurality of ferromagnetic particles embedded in a polymer matrix;
   providing a plurality of magnets configured to direct magnetic forces through the bonding sites to the balls;
   aligning the balls to the bonding sites using the magnets; and
   bonding the balls to the bonding sites.

7. A method for forming contacts on a semiconductor component comprising:
   providing a plurality of bonding sites on the component having a first pattern;
   providing a plurality of balls comprising a ferromagnetic material;
   providing a plurality of magnets having a second pattern matching the first pattern and configured to align the balls to the bonding sites;
   providing a holder with the magnets thereon configured to hold the component with the bonding sites in alignment with the magnets;
   aligning the balls to the bonding sites using the magnets and the holder; and
   bonding the balls to the bonding sites.

8. The method of claim 7 wherein each ball comprises a ferromagnetic core and a solder outer layer.

9. The method of claim 7 wherein each ball comprises a plurality of ferromagnetic particles embedded in a solder outer layer.

10. The method of claim 7 wherein each ball comprises a plurality of ferromagnetic particles embedded in a polymer adhesive matrix.

11. The method of claim 7 wherein the bonding step comprises heating the balls.

12. A method for forming contacts on a semiconductor component comprising:
   providing a plurality of bonding sites in a first pattern on the component;
   providing a plurality of balls comprising a ferromagnetic material;
   providing a holder comprising a plurality of magnets having a second pattern matching the first pattern, the holder configured to hold the semiconductor component and to align the bonding sites to the magnets;
   aligning the balls to the bonding sites by placing the component in the holder and applying magnetic forces through the bonding sites to the balls using the magnets;
   holding the balls on the bonding sites using the magnets; and
   bonding the balls to the bonding sites.

13. The method of claim 12 wherein each ball comprises a ferromagnetic core embedded in a solder outer layer.

14. The method of claim 12 wherein each ball comprises ferromagnetic particles embedded in a solder outer layer.

15. The method of claim 12 wherein each ball comprises ferromagnetic particles embedded in a polymer adhesive matrix.

16. The method of claim 12 wherein each ball comprises a solid ferromagnetic sphere.

17. A method for forming contacts on a semiconductor component comprising:

providing a plurality of bonding sites in a first pattern on the component;

providing a plurality of balls configured for bonding to the bonding sites and comprising a ferromagnetic material;

providing a holder configured to hold the component and comprising magnets having a second pattern matching the first pattern;

placing the component on the holder with the magnets aligned with the bonding sites;

applying magnetic forces through component to the bonding sites to align and hold the balls on the bonding sites; and bonding the balls to the bonding sites.

18. The method of claim 17 wherein the balls comprise solder and the bonding step comprises placing the holder with the component thereon in a furnace configured to reflow the solder.

19. The method of claim 17 wherein the bonding step comprises focusing an energy source on the balls.

20. The method of claim 17 wherein the holder comprises an alignment opening configured to contact a peripheral edge of the component to align and retain the component.

21. The method of claim 17 wherein the balls comprise ferromagnetic particles embedded in a polymer material and the bonding step comprises curing the polymer matrix by heating.

22. A method for forming contacts on a semiconductor component comprising:

providing a plurality of bonding sites on the semiconductor component in a first pattern;

providing a plurality of balls comprising a polymer and a plurality of ferromagnetic particles embedded in the polymer;

providing a plurality of magnets in a second pattern matching the first pattern and configured to align the balls to the bonding sites;

aligning the balls to the bonding sites using the magnets; and bonding the balls to the bonding sites.

23. The method of claim 22 wherein the polymer comprises a thermoplastic or a thermosetting adhesive.

24. The method of claim 22 further comprising providing the magnets on a holder configured to hold the component with the bonding sites in alignment with the magnets and the aligning step is performed using the holder.

25. The method of claim 22 wherein the ferromagnetic particles comprise a material selected from the group consisting of iron, steel, nickel, cobalt, titanium, aluminum or magnetic stainless steel.

26. A method for forming contacts on a semiconductor component comprising:

providing a plurality of bonding sites on the semiconductor component;

providing a plurality of balls comprising a ferromagnetic material;

providing a plurality of magnets configured to direct magnetic forces on the balls;

aligning the balls to the bonding sites by moving the balls proximate to the magnets and adjusting the magnetic forces; and bonding the balls to the bonding sites.

27. The method of claim 26 wherein the magnets comprise electromagnets.

28. The method of claim 26 wherein each ball comprises a ferromagnetic core and a solder outer layer.

29. The method of claim 26 wherein each ball comprises ferromagnetic particles embedded in a polymer matrix.

30. The method of claim 26 wherein each ball comprises a solid ferromagnetic sphere.

31. The method of claim 26 wherein each ball comprises a solid ferromagnetic ball at least partially covered with an electroconductive polymer adhesive.

* * * * *